(12) United States Patent
Haigh

(10) Patent No.: US 10,303,191 B2
(45) Date of Patent: May 28, 2019

(54) METHOD AND APPARATUS FOR CONTROLLING THE TEMPERATURE OF COMPONENTS

(71) Applicant: Seagate Technology LLC, Cupertino, CA (US)

(72) Inventor: David C. Haigh, Winchester (GB)

(73) Assignee: Seagate Technology LLC, Cupertino, CA (US)

( * ) Notice: Subject to any disclaimer, the term of this patent is extended or adjusted under 35 U.S.C. 154(b) by 138 days.

(21) Appl. No.: 15/601,254

(22) Filed: May 22, 2017

(65) Prior Publication Data

US 2017/0255211 A1 Sep. 7, 2017

Related U.S. Application Data

(62) Division of application No. 13/427,453, filed on Mar. 22, 2012, now Pat. No. 9,658,629.

(51) Int. Cl.
| | | |
|---|---|---|
| *G06F 1/20* | (2006.01) | |
| *H05K 7/20* | (2006.01) | |
| *G05D 23/19* | (2006.01) | |
| *G11B 33/14* | (2006.01) | |

(52) U.S. Cl.
CPC .......... *G05D 23/1931* (2013.01); *G06F 1/20* (2013.01); *G06F 1/206* (2013.01); *G11B 33/142* (2013.01); *G11B 33/144* (2013.01); *G11B 33/1413* (2013.01); *H05K 7/207* (2013.01); *G06F 2200/201* (2013.01)

(58) Field of Classification Search
CPC ....... G05D 23/1931; G06F 1/20; G06F 1/206; G06F 2200/201; G11B 33/144; G11B 33/142; G11B 33/1413; H05K 7/207
See application file for complete search history.

(56) References Cited

U.S. PATENT DOCUMENTS

| | | | |
|---|---|---|---|
| 3,577,765 A | 5/1971 | Bertoglio et al. | |
| 4,042,813 A | 8/1977 | Johnson | |
| 4,197,581 A | 4/1980 | Watrous et al. | |
| 4,528,635 A | 7/1985 | Juodikis et al. | |
| 4,734,872 A * | 3/1988 | Eager ................. | G01R 31/2891 374/135 |
| 5,058,389 A | 10/1991 | Yasuda et al. | |
| 5,207,379 A | 5/1993 | Hurmi et al. | |
| 5,213,077 A | 5/1993 | Nishizawa et al. | |
| 5,325,288 A | 6/1994 | Satou | |
| 6,059,195 A | 5/2000 | Adams et al. | |
| 6,247,678 B1 | 6/2001 | Hines et al. | |
| 6,415,619 B1 | 7/2002 | Bash et al. | |

(Continued)

*Primary Examiner* — Ljiljana V. Ciric
(74) *Attorney, Agent, or Firm* — Holzer Patel Drennan

(57) ABSTRACT

A method and apparatus for the temperature control of a component within a storage system wherein the storage system includes a heat exchanger in thermal communication with the component to control the temperature of the component. One method includes: generating a flow of heat transfer fluid through the heat exchanger to transfer heat to or from the heat exchanger; receiving a set point signal indicative of the desired temperature of the component in the storage system; receiving temperature data regarding the component and the heat transfer fluid, and generating an output signal to control the flow of heat transfer fluid. The heat transfer fluid may be a gas or liquid.

18 Claims, 8 Drawing Sheets

Model used to analyze heat flow, liquid coolant version

Model used to analyze heat flow, liquid coolant version

(56) References Cited

U.S. PATENT DOCUMENTS

| | | | |
|---|---|---|---|
| 6,748,546 B1* | 6/2004 | Mirov | G06F 1/08 |
| | | | 713/320 |
| 6,845,457 B1* | 1/2005 | Mirov | G06F 1/08 |
| | | | 713/320 |
| 6,850,856 B1* | 2/2005 | Gauthier | G06F 1/32 |
| | | | 327/51 |
| 6,882,924 B2 | 4/2005 | Miller | |
| 7,859,554 B2 | 12/2010 | Young | |
| 8,417,482 B2 | 4/2013 | Bohan et al. | |
| 8,580,569 B2 | 11/2013 | Linder et al. | |
| 8,909,384 B1* | 12/2014 | Beitelmal | G06F 1/206 |
| | | | 700/19 |
| 2002/0109935 A1* | 8/2002 | Korbel | G11B 5/5521 |
| | | | 360/78.06 |
| 2006/0122673 A1 | 6/2006 | Callister et al. | |
| 2008/0072608 A1 | 3/2008 | Rampersad | |
| 2009/0068025 A1 | 3/2009 | Shah et al. | |
| 2009/0192634 A1 | 7/2009 | Fujinaka | |
| 2009/0195923 A1 | 8/2009 | Strom et al. | |
| 2010/0082309 A1* | 4/2010 | Dawson | G06F 1/20 |
| | | | 703/6 |
| 2010/0087900 A1 | 4/2010 | Flint | |
| 2010/0106309 A1* | 4/2010 | Grohman | G05D 27/02 |
| | | | 700/276 |
| 2010/0292813 A1 | 11/2010 | Boiko et al. | |
| 2010/0312364 A1 | 12/2010 | Eryilmaz et al. | |
| 2011/0045952 A1 | 2/2011 | Bergeon et al. | |
| 2011/0222234 A1 | 9/2011 | Davis et al. | |
| 2012/0020005 A1 | 1/2012 | Collins | |
| 2012/0020007 A1 | 1/2012 | Collins | |
| 2012/0168417 A1 | 7/2012 | Chiu | |
| 2013/0138252 A1 | 5/2013 | Chainer et al. | |
| 2013/0138253 A1 | 5/2013 | Chainer et al. | |
| 2014/0233176 A1* | 8/2014 | Montero | G06F 1/206 |
| | | | 361/679.48 |
| 2016/0124475 A1* | 5/2016 | Chandra | G06F 1/3234 |
| | | | 700/300 |
| 2017/0089603 A1* | 3/2017 | Bentz | G05B 19/0428 |

* cited by examiner

Conventional Discrete PID Controller

Model used to analyze heat flow, liquid coolant version

METHOD AND APPARATUS FOR CONTROLLING THE TEMPERATURE OF COMPONENTS

CROSS-REFERENCE

The present application is a divisional application of U.S. application Ser. No. 13/427,453 filed Mar. 22, 2012, now U.S. Pat. No. 9,658,629, the entire disclosures of which are incorporated herein by reference.

BACKGROUND

The present invention relates to a method and apparatus for controlling the temperature of components which are cooled by variable speed coolant flow. For example, in embodiments, the invention relates to methods and apparatus for controlling the temperature of components using the control of air provided by a variable speed fan, or a liquid coolant provided by a variable speed pump.

The primary fields of use for the present method and apparatus is in the control of the temperature of disk drives or storage media within data storage or test systems such as storage enclosures, racks or even test racks such as might be used during manufacture of disk drives or storage media. A test system would include a system for testing disk drives during manufacture. FIGS. 1A and 1B show schematic representation of examples of storage systems.

For brevity, the description from hereon will relate primarily to data storage systems, although it will be appreciated that the method and apparatus are equally applicable to test systems. Furthermore, as used herein, "storage system" is used in place of "data storage system". Storage systems typically include plural storage media arranged somehow to enable data to be written to and read from individual media. The plural storage media are interconnected to storage interface modules to create a storage system. The media may be disk drives, solid state drives, or any other form of data storage medium. The storage interface modules may be interface switches, interface controllers, RAID controllers, processing modules or similar. The storage interface modules may be located remotely to the storage media, for example in the rear of an enclosure where the storage media are in the front of the enclosure, or co-located with the storage media, for example Interface switches (SAS Expanders) co-located with the disk drives in the front of an enclosure.

As the size and capacity of storage systems increases, there is an increasing need to provide efficient and effective means for temperature control and, in particular, cooling of the media such as disk drives within the storage system. Typically, a storage system includes storage modules which each contain plural disk drives and storage interface modules which provide internal and external connectivity between the storage media and the storage system external data fabric. It is known to pass cooling air through the storage system so as to remove heat produced in operation by the disk drives and thereby provide cooling to the storage system as a whole.

A typical example of prior art would use a 'blade' type structure. The 'blade' is high but narrow, allowing multiples to be fitted across the width of a rack, typically 10 or 12. Depth is determined by the number of drives being installed, but would typically be 3 drives deep and in to order of 500 mm. The structure of the blades limit the airflow across the installed devices and the density that can be achieved. Fully loaded blades can be heavy and this limits the maintenance and serviceability of the resultant system. Their weight also requires a structure across the width of the rack to support them.

FIG. 1A shows a schematic representation of such a blade storage system. As can be seen the storage system 1 comprises plural blades 3 arranged within the housing 5 of the storage system 1. Structure (not shown) across the width of the rack is provided to support the weight of the blades.

In contrast, a drawer-based system, as shown in FIG. 1B, uses a sliding drawer the full (or half) the width of the rack, but of low height. The height is governed by the storage media (or storage interface modules) installed, such that a single storage medium, e.g. an individual disk drive, is accessible and serviceable from the top of the drawer. The depth of the drawer is determined by the number of storage media installed, but is not limited in the same way as the blade. Since every storage media is individually serviceable the overall weight of the drawer does not become a serviceability limit. In contrast to the blade, the drawer is supported at its sides by the rack structure, relying on the strength of the drawer itself to provide support for the installed storage media.

One example of systems utilizing aspects of the invention comprises a rack into which are placed plural storage modules. Each of the storage modules contains two drawers which, in turn, each contain plural disk drives. At the rear of the storage system, storage interface modules provide control, input and output functionality. This is the means by which data may be written to or read from disk drives within the storage system.

Conventionally, one commonly used way to control the temperature of components in a storage system is with the use a "Proportional, Integral and Derivative" controller, commonly referred to as a PID or three term controller. A schematic example of a PID controller is shown in FIG. 2.

The PID controller 2 is arranged to receive as inputs an actual measured component temperature 4 and a set point value 6. Based on these inputs, an output signal 8 is generated representing a requested fan speed. In the example shown, the controller 2 is for use in controlling the speed of a cooling fan.

In accordance with PID control theory and as is well known, the output signal 8 is determined by three inputs 10, 12 and 14. The first input 10 is the "proportional" term and is based on the simple difference or "error" between the set point signal 6 and the actual measured component temperature 4. The second input signal 12 is produced by a differentiator 16 which is configured to receive the error signal and perform some further processing on it to derive the rate of change of the error signal. The third input signal 14 is a product of an integrator 18 which, again, is arranged to receive the error signal and further process it to derive a running sum of past error signal values. Each of the input signals 10, 12 and 14 is produced by the respective upstream component multiplied by a factor $K_P$, $K_D$ and $K_I$ which is a constant. In a cooling control system, the output signal 8 may be used to drive a fan (not shown).

Thus, it can be seen that such a conventional PID controller functions in dependence on a difference between the actual and desired temperatures of the component as represented by the two input signals 4 and 6 it receives. In dependence on these, an output signal 8 is generated driving a new fan speed. By relying on continual adjustment of the fan speed the component temperature is accordingly controlled and brought towards the desired set point temperature.

PID controllers generally work well. They are particularly the best choice where there is an absence of knowledge of the underlying process. In the example given above, the underlying process can be thought of as being the flow of air past the component being cooled or temperature regulated. All the controller "knows" is that a certain fan speed is required, the knowledge being based on the measured temperature of the component and a set point temperature. Accordingly, with this limited knowledge there are situations where the control it provides will not be optimal.

SUMMARY

According to a first aspect of the present invention, there is provided a method of temperature control for a component within a storage system wherein the storage system includes a heat exchanger in thermal communication with the component, the method comprising: generating a flow of heat transfer fluid through the heat exchanger, to transfer heat to or from the heat exchanger; receiving a set point signal indicative of the desired temperature of the component in the storage system; receiving temperature data regarding the component and the heat transfer fluid, and in dependence on the set point signal and the temperature data generating an output signal to control the flow of heat transfer fluid.

A method of temperature control is provided that enables improved control of the temperature of a component within a storage system. In large data storage systems the control of temperature can be an important factor in the efficient operation of the system as a whole. If a storage device such as a hard disk drive or Solid State drive becomes too hot it can cease to function as it should, or in extremis cease to function at all. Furthermore other components within the data storage system such as power supply units or data transfer (i/o) controllers also have desired optimal temperature operating ranges. The present method therefore provides significant and useful advantages.

In contrast to known temperature controllers, such as a conventional PID controller, which typically operate simply based on a set point signal and the component temperature signal, the present method uses in addition the temperature of the temperature control fluid within the system. Thus, an additional level of knowledge is available to the controller to better and more reactively and predictively control the temperature of components within the storage system and to drive the flow of heat transfer fluid in an appropriate way. For example, it might be that the temperature of a component has changed in such a way that the error signal is reduced and so this would, with an ordinary PID controller, cause some defined change in the drive signal for the fan or pump. The present system allows a higher level of control since it is capable of taking into account parameters associated with the heat transfer fluid itself and not merely the measured temperature of the component. Having this knowledge allows more accurate and improved temperature control.

In an embodiment, the data regarding the heat transfer fluid includes the temperature of the heat transfer fluid before it flows into the heat exchanger and the temperature of the heat transfer fluid that flows out of the heat exchanger.

In an embodiment, heat transfer fluid flow rate is used in the determination of the output signal. By using the heat transfer fluid flow rate improved temperature control can be achieved. In conventional PID controllers there is no knowledge at all of the flow rate of the heat transfer fluid. Rather there is simply the knowledge of the set point temperature and the component temperature. The output signal generated by the controller is simply calculated to increase or decrease the output of either the fan or pump based on these. However this is done without knowledge of what effect this may or may not have on the flow rate of the heat transfer fluid and in turn how this may affect the component temperature. Thus, by using this knowledge, if desired quicker or larger jumps in fluid flow rate can be made without risk of damage to the system.

In an embodiment, the heat transfer fluid is a gas and the flow is generated with a fan.

In an embodiment, the heat transfer fluid is a liquid and the flow is generated with a liquid pump.

In an embodiment, in dependence on the identified required fan speed a determination is made as to whether or not the required speed is allowed, and if it is operating the fan at the required speed, and if it is not operating it a speed close to the required speed. In other words, a speed censor is provided that stops the fan operating at certain fan speeds that are known to cause likely problems with the storage system at large. Thus, if there are resonant frequencies within the storage system, the fan can be stopped from acting at that speed even if the speed is what is determined to be required according to the basic algorithm, discussed in detail below. The actual speed that the fan will be run will be slightly below or above the determined amount so as to cause minimal change in temperature control but so as to avoid any undesirable resonance.

In an embodiment using a pump, it is also possible that certain pump speeds may similarly cause resonance problems, in which case the pump speed may be censored in the same way as a fan speed.

In an embodiment, the output signal is generated using a modified PID controller.

In an embodiment, in generating the output signal, a factor is used that depends not only on the error signal but also on the temperature of the heat transfer fluid both before and after it has encountered the heat exchanger. As explained above, in a conventional controller such as a PID controller there is no knowledge at all of the parameters of the system that it is actually controlling over and above the very basic set point signal (representing a desired temperature) and the component temperature itself. By using knowledge of the temperature of the heat transfer fluid improved control can be achieved since a more direct means of control is enabled.

In an embodiment, in generating the output signal, a factor is used that depends on change with respect to time of temperature of the component.

In an embodiment, the change $\delta F$ in flow rate of the heat transfer fluid is determined in accordance with the following equation:

$$\delta F = K_P \frac{2F}{T_O - T_I}(T_C - T_S) + K_D \frac{2M(T_C - T_I)}{(T_O - T_I)^2}\frac{dT_C}{dt} + K_T \frac{2F}{T_O - T_I}\delta T_I$$

in which,
F is the heat transfer fluid flow rate;
Tc is the measured component temperature;
Ts is the set point temperature;
$T_I$ is the temperature of the heat transfer fluid before it flows into the heat exchanger;
To is the temperature of the heat transfer fluid that flows out of the heat exchanger; and
$K_P$, $K_D$, $K_T$ and M are system constants.

In an embodiment, the system includes j components and the method comprises, based on some criteria, selecting one of the j components as the control component whose temperature is used to determine required changes in heat transfer fluid flow rate.

In an embodiment, the change of in flow rate of the heat transfer fluid is determined in accordance with the following equation:

$$\delta F = K_{Pj}\frac{2F}{T_{Oj}-T_{Ij}}(T_{Cj}-T_{Sj}) + K_{Dj}\frac{2M_j(T_{Cj}-T_{Ij})}{(T_{Oj}-T_{Ij})^2}\frac{dT_{Cj}}{dt} + K_{Tj}\frac{2F}{T_{Oj}-T_{Ij}}\delta T_{Ij}$$

in which
F is the heat transfer fluid flow rate at the fan or pump;
$T_{Cj}$ is the measured component temperature for component j;
$T_{Sj}$ is the set point temperature for component j;
$T_{Ij}$ is the temperature of the heat transfer fluid before it flows into the heat exchanger;
$T_{Oj}$ is the temperature of the heat transfer fluid that flows out of the heat exchanger; and
$K_{Pj}$, $K_{Dj}$, $K_{Tj}$, and M system constants.

According to a second aspect of the present invention, there is provided temperature control system for a component within a data storage system wherein the storage system includes a heat exchanger in thermal communication with the component, the controller comprising: a flow generator for generating a flow of heat transfer fluid through the heat exchanger, to transfer heat to or from the heat exchanger; a set point generator for generating a set point signal indicative of a desired temperature for the component in the storage system; a controller for receiving temperature data regarding the heat transfer fluid, and being arranged in dependence on set point signal and the data regarding the heat transfer fluid generating an output signal to control the flow generator.

In an embodiment, the system comprises a first temperature sensor for sensing the temperature of the component; a second temperature sensor for sensing the temperature of the heat transfer fluid before it flows into the heat exchanger; and, a third temperature sensor for sensing the temperature of the heat transfer fluid that flows out of the heat exchanger.

In an embodiment, the system comprises a first temperature sensor for sensing the temperature of the heat transfer fluid before it flows into the heat exchanger; and, a second temperature sensor for sensing the temperature of the heat transfer fluid that flows out of the heat exchanger, the temperature of the component being inferred from the two heat transfer fluid temperatures. In other words, instead of (and/or as well as) measuring the temperature of the component directly, it is possible that a value for the component temperature is inferred from that of the heat transfer fluid in its vicinity.

In an embodiment, the system comprises one or more couplings for coupling temperature signals from the temperature sensors to the controller for processing.

In an embodiment, the heat transfer fluid flow rate is used in the determination of the output signal.

In an embodiment, the heat transfer fluid is a gas and the flow is generated with a fan.

In an embodiment, the heat transfer fluid is a liquid and the flow is generated with a liquid pump.

In an embodiment, the controller, in dependence on the identified required fan speed, is arranged to determine whether or not the required speed is allowed, and if it is, operating the fan at the required speed, and if it is not operating it a speed close to the required speed.

In other words, the controller provides the function of a speed censor that stops the fan operating at certain fan speeds that are known to cause likely problems with the storage system at large. Thus, if there are resonant frequencies within the storage system, the fan can be stopped from acting at that speed even if the speed is what is determined to be required according to the basic algorithm, discussed in detail below. The actual speed that the fan will be run will be slightly below or above the determined amount so as to cause minimal change in temperature control but so as to avoid any undesirable resonance. The speed censor can be provided as a separate component or piece of logic or as an integrated part of the controller.

In an embodiment, the controller is a modified PID controller, arranged to generate the output signal, using a factor that depends on the temperature of the heat transfer fluid both before and after it has encountered the heat exchanger.

In an embodiment, the system comprises the controller is arranged, in generating the output signal, to use a factor that depends on change with respect to time of temperature of the component.

In an embodiment, the controller is arranged to calculate the required change δF in flow rate of the heat transfer fluid in accordance with the following equation:

$$\delta F = K_P\frac{2F}{T_O-T_I}(T_C-T_S) + K_D\frac{2M(T_C-T_I)}{(T_O-T_I)^2}\frac{dT_C}{dt} + K_T\frac{2F}{T_O-T_I}\delta T_I$$

in which,
F is the heat transfer fluid flow rate;
Tc is the measured component temperature;
Ts is the set point temperature;
$T_I$ is the temperature of the heat transfer fluid before it flows into the heat exchanger;
$T_O$ is the temperature of the heat transfer fluid that flows out of the heat exchanger; and
$K_P$, $K_D$, $K_T$, and M system constants.

In an embodiment, the system includes j components and the method comprises, based on some criteria, selecting one of the j components as the control component whose temperature is used to determine required changes in heat transfer fluid flow rate.

In an embodiment, the change δF in flow rate of the heat transfer fluid is determined in accordance with the following equation:

$$\delta F = K_{Pj}\frac{2F}{T_{Oj}-T_{Ij}}(T_{Cj}-T_{Sj}) + K_{Dj}\frac{2M_j(T_{Cj}-T_{Ij})}{(T_{Oj}-T_{Ij})^2}\frac{dT_{Cj}}{dt} + K_{Tj}\frac{2F}{T_{Oj}-T_{Ij}}\delta T_{Ij}$$

in which
F is the heat transfer fluid flow rate at the fan or pump;
$T_{Cj}$ is the measured component temperature for component j;
$T_{Sj}$ is the set point temperature for component j;
$T_{Ij}$ is the temperature of the heat transfer fluid before it flows into the heat exchanger for component j;
$T_{Oj}$ is the temperature of the heat transfer fluid that flows out of the heat exchanger for component j; and
$K_{Pj}$, $K_{Dj}$, $K_{Tj}$ and $M_j$ are system constants for component j.

In an embodiment, the controller is provided as one or more of an ASIC and an FPGA and a programmable microprocessor.

According to a third aspect of the present invention, there is provided, a method of temperature control for a component within a storage system wherein the storage system, the method comprising: generating a flow of heat transfer fluid through the heat exchanger, to transfer heat to or from the component; receiving a set point signal indicative of the desired temperature of the component in the storage system; receiving temperature data regarding component and the heat transfer fluid, and in dependence on the set point signal and the temperature data generating an output signal to control the flow of heat transfer fluid.

A method of temperature control is provided that enables improved control of the temperature of a component within a storage system. In large data storage systems, the control of temperature can be an important factor in the efficient operation of the system as a whole. A flow of heat transfer fluid is arranged to pass in direct contact with a component such that heat is transferred directly to or from the component from or to the heat transfer fluid. Data regarding the heat transfer fluid, e.g. the temperature profile of the fluid as it passes the component may be used to enable control of the temperature of the component.

In an embodiment, the temperature of the heat transfer fluid before and after it encounters the component is used. By determining such a temperature profile the transfer of heat to/from the component can be accurately determined and controlled.

According to a further aspect of the present invention, there is provided a method of determining a required change $\delta G$ in flow rate G for a coolant in a system in which the coolant is arranged to cool a component at temperature $T_C$ and in which the temperature of the coolant before it encounters heat from the component is $T_I$ and the temperature of the coolant after it encounters heat from the component is $T_O$, in which the specific heat capacity of the coolant is $C_A$ and in which the heat capacity of the component is H, the method comprising using the following equation $$\delta G \approx \frac{2H(T_C - T_I)}{C_A(T_O - T_I)^2} \frac{dT_C}{dt}$$

to determine $\delta G$.

In an embodiment, the method comprises, prior to determining the value of G, determining a value for H using the following steps:
(a) allow the system to reach a stable situation
(b) using a flow rate register, allow the flow rate register to contain the value FM,
(c) note the values of $T_I$ and $T_O$ and call them $T_{Ia}$ and $T_{Oa}$,
(d) change the power being dissipated in the component by the amount WM,
(e) observe the immediate rate of change of the temperature of the component and
call it Rc, in which the value of H is then given by $$H = \frac{W_M}{R_C}.$$

In an embodiment, the method comprises, when the system has again reached a stable situation, note the new value of $T_O$ ($T_{Ob}$), and again determine the value of $T_I$ ($T_{Ib}$) in case it has changed, in which $$T_M = (T_{Ob} - T_{Ia}) - (T_{Oa} - T_{Ia}).$$

and using equation $$(T_O - T_I)C_A G = W$$

showing that the value of $k_F$ is given by $$k_F = \frac{F_M C_A T_M}{W_M}.$$

in which $k_F$ is the conversion factor from the value G of the flow rate measured in grams per second to the value F of the flow rate measured in flow rate register units, i.e., $F = k_F G$.

BRIEF DESCRIPTION OF THE DRAWING

Embodiments of the present invention will now be described in detail with reference to the accompanying drawings, in which.

DESCRIPTION

Figures 1A, 1B:
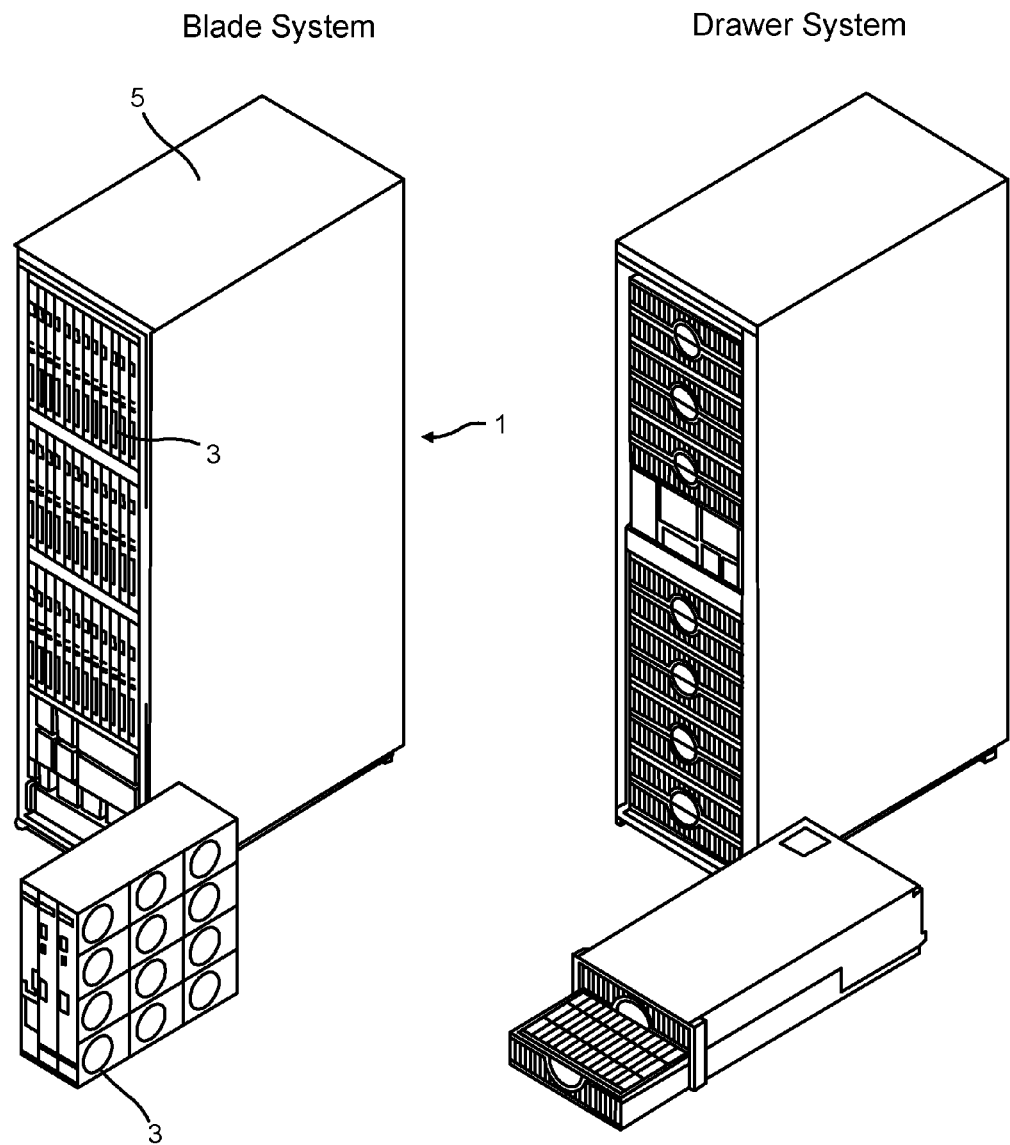
FIGS. 1A and 1B show schematic representations of examples of storage systems.
Figure 2:
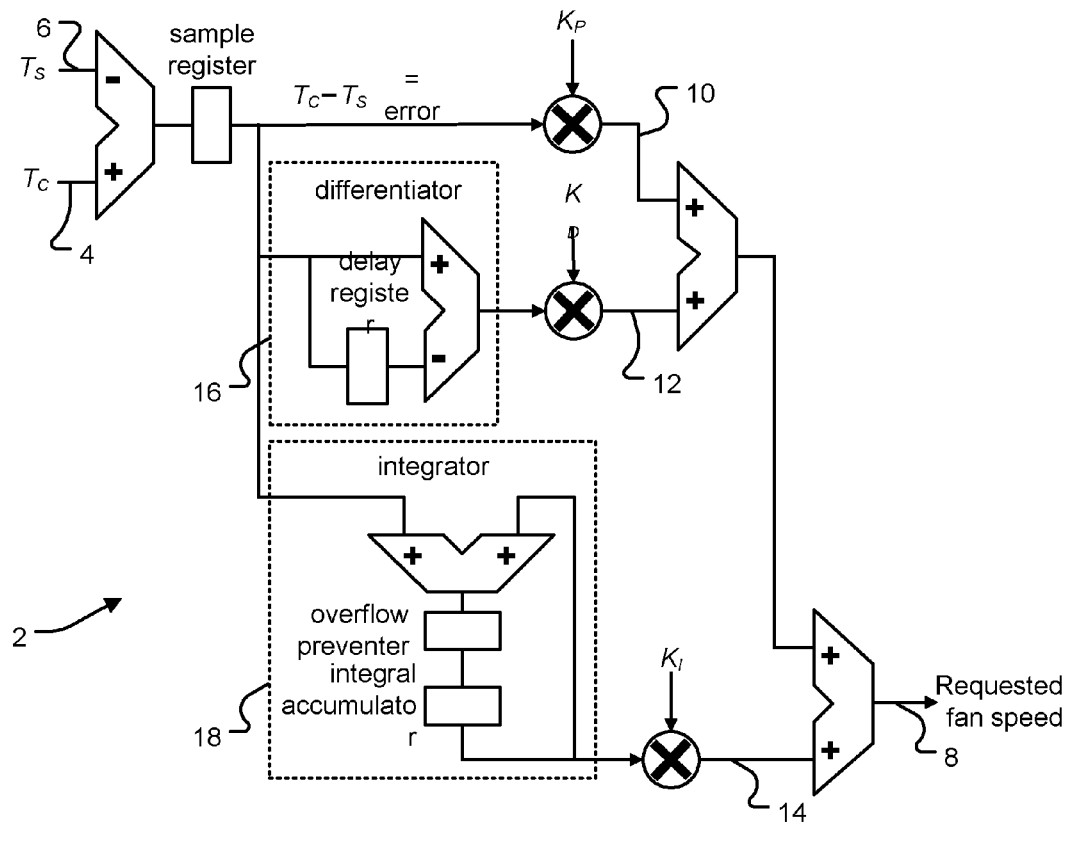
FIG. 2 is a schematic representation of a PID controller.
Figure 3:
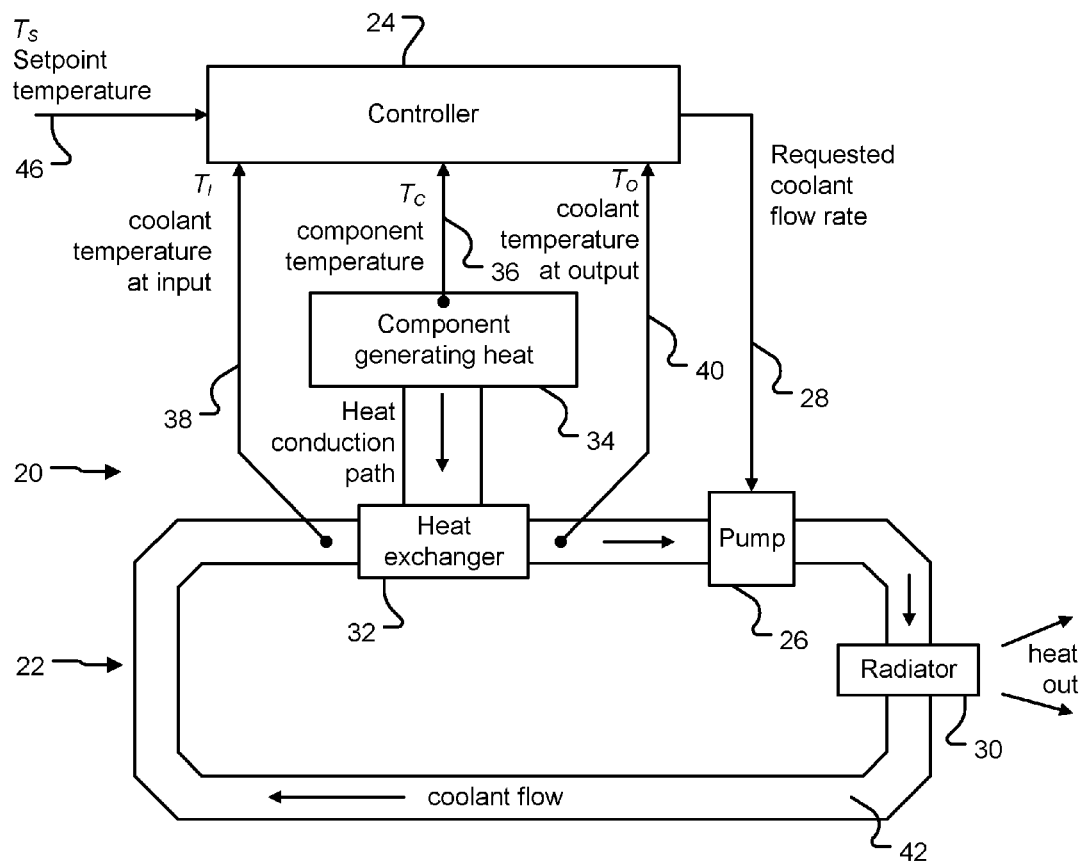
FIG. 3 is a schematic representation of a temperature controller.
Figure 4:
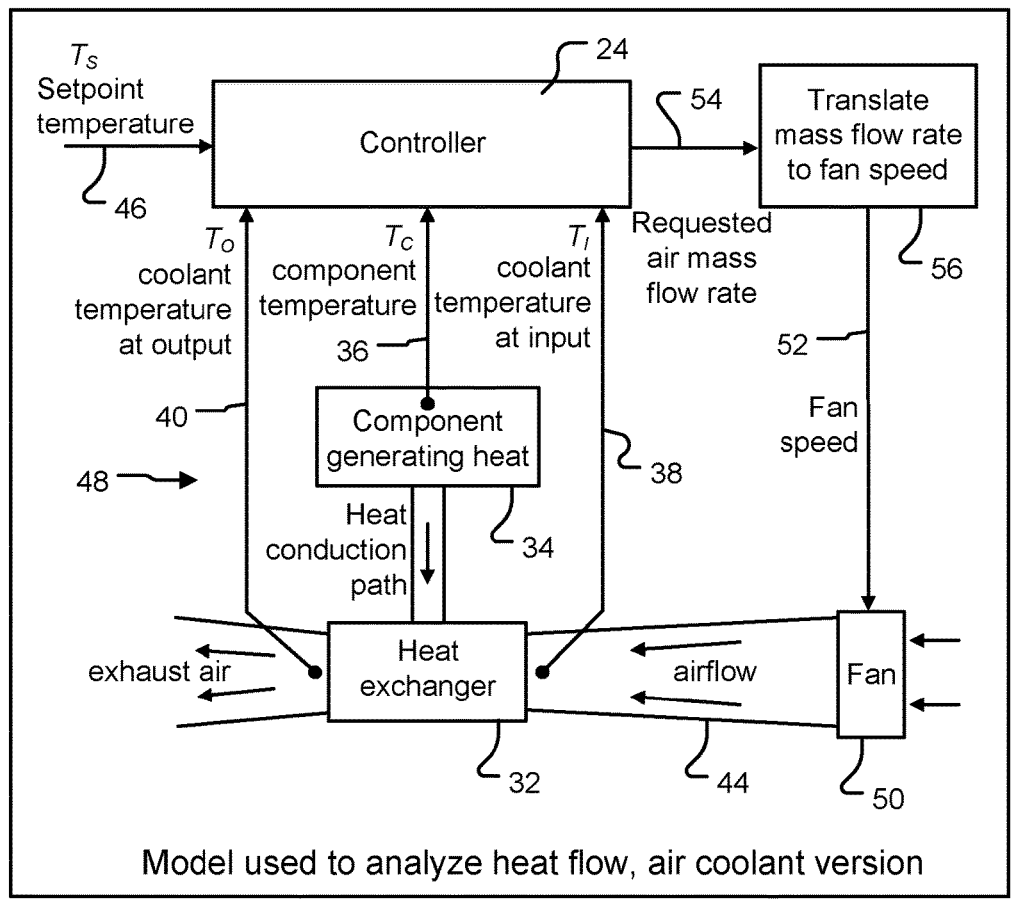
FIG. 4 is a schematic representation of a temperature controller.

FIGS. 3 and 4 show schematic representations of controllers which, unlike the controller of FIG. 2, utilize knowledge of the behavior of the system whose component temperatures it is actually controlling. In other words, instead of simply relying on a set point temperature and a component temperature, two further signals $T_1$ and To are provided as inputs to the controller. As will be explained below, these signals represent the heat transfer fluid (sometimes referred to herein as the "coolant") temperature at an input and output to the associated heat exchanger 32 used to control the temperature of the component.

Referring in detail to FIG. 3, a control system 20 is provided including a heat flow circuit 22 and a controller 24 for generating control signals to drive the flow of coolant.

A pump 26 is provided arranged to receive an input signal 28 from the controller 24. A radiator 30 is provided within the heat flow circuit 22 to enable heat to be removed from the circuit 22. A heat exchanger 32 is provided thermally coupled to a component 34 which is being cooled by the system 20. Typically, the component might be a hard disk drive within a storage enclosure or some other electronic component that may be within a larger system. As mentioned above, it is envisaged that the primary field of use for the present method and apparatus is in the control of the temperature of disk drives within storage systems such as storage enclosures and racks.

The heat exchanger could be a purpose designed additional component or could simply be a part of the housing or covering of the component being cooled. It represents the heat conduction path between the source of heat in the component and the coolant. The controller 24 is also arranged to receive plural input signals from various positions within the control system 20, as will be explained in detail below. The temperatures of the coolant flow before and after encountering the heat exchanger could be measured at physical locations immediately next to the component or heat exchanger, or at locations more remote, i.e. further upstream or downstream, so long as the measured temperatures are representative of the temperatures at the locations close to the heat exchanger.

First, a signal Tc 36 is provided to the controller 24, the signal being indicative of the temperature of the component 34 that is generating the heat. Second and third, signals $T_I$ 38 and $T_O$ 40 are also provided. The signal $T_1$ represents the temperature of the coolant at the input to the heat exchanger. The signal $T_O$ represents the temperature of the coolant at the exit from the heat exchanger. As mentioned above, the heat exchanger may be an independent component having defined inputs and outputs for fluid flow therethrough.

In an alternative, the heat exchanger could be part of the housing of the component. In other words, it is simply the means by which heat is exchanged from the component to the heat transfer fluid. In such a case the input to the heat exchanger would be understood to be the point within the flow of heat transfer fluid immediately prior to encountering the thermal environment of the component, and the output from the heat exchanger would be point within the flow of heat transfer fluid immediately after leaving the thermal environment of the component. The difference between T1 and To is a measure of the heat transferred to the coolant from the component 34. A set point temperature signal Ts 46 is provided as an input to the controller 24.

Last, the flow of coolant 42 is shown schematically to pass from the radiator 30 through the heat exchanger 32 under influence of the pump 26. As will be described below, with the use of the additional signals $T_1$ and To, improved temperature control of the component 34 can be achieved.

FIG. 4 shows an example of an alternate control system 48 similar to that of FIG. 3. Common components and signals are identified with the same reference numerals. There are however some differences. In the example of FIG. 4, a fan is used to generate an airflow 44 which is arranged to pass through the heat exchanger 32. The fan 50 is arranged to receive a signal 52 provided in dependence on an output signal 54 from the controller 24. The signal 54 represents the requested air mass flow rate. A component 56 is provided to receive the signal 54 and generate the fan speed signal 52 in dependence thereon. In functional and thermodynamic terms, the systems are substantially the same.

It will be appreciated that the present method therefore removes the "distance" between a conventional PID controller and the system being controlled. Typically a PID controller has no knowledge of what it is that is being controlled or how the control is achieved, over above the very basic feature that an error signal is generated and that based on this error signal an output signal is provided. For example, when a fan is being used to cool a component under control of a conventional PID controller, the PID controller does not actually have any knowledge of how the air flow directly affects the component being cooled. It merely knows that the speed of the fan should be increased, decreased or maintained constant, in dependence on the error signal. The degree and accuracy of control is accordingly correspondingly limited.

As will be explained in detail below, the present method effectively removes this distance between the controller and the system being controlled, by utilizing knowledge of the flow and associated parameters of the heat transfer fluid.

The means by which the control systems 20 and 48 operate will now be described.

A component or group of components at temperature $T_C$ ° C. dissipating W watts is cooled by a stream of coolant or heat transfer fluid provided by a variable speed fan 50 or pump 26. The component(s) being cooled are modelled by a single mass having heat capacity H joules per ° C. The mass flow rate of the coolant is G grams per second; this is represented by a number F held in a flow rate register, described below. Units of F are conveniently such that the maximum value that the register can hold represents the maximum achievable value of mass flow rate G. In both examples, the coolant enters the heat exchanger at temperature $T_1$ and leaves at a temperature $T_O$. The specific heat capacity of the coolant is $C_A$ joules per ° C. per gram. The temperatures, Tc, $T_I$ and To are measured by suitable sensors, which include thermocouples, thermistors and resistance thermometers. The controller 24, in both cases, is arranged to adjust the coolant flow rate so as to keep the component at the set point temperature Ts despite variations in the power dissipated and/or the input coolant temperature.

The controller 24, in use, demands a certain mass flow rate of coolant. If the coolant is an incompressible liquid, as might be the case in the example of FIG. 3, the specified mass flow rate can be provided by the pump 26 whose throughput is proportional to its speed. However, as in the example of FIG. 4, in which the coolant is a gas such as air, the requested mass flow rate is first translated into an equivalent fan speed, for example by use of a look up table or some programmed logic. Because the pressure rise across the fan is typically very small, of the order of 1%, the mass flow rate is essentially proportional to the volume flow rate.

However the relationship between the volume flow rate through an enclosure and fan speed can be complicated. Typically, it depends on the shape of the fan curve, which plots volume flow rate through the fan against pressure difference across the fan and on the aerodynamic impedance of the enclosure, which depends on whether the air flow in the enclosure is laminar or turbulent. Typically it will be a mixture of these, the proportion being dependent on the air speed. Thus, although in some situations the volume flow rate (and hence the mass flow rate) may be proportional to the fan speed, in general it is best to assume that this is not the case. If it were then the output signal 54 would be able to be coupled directly to the fan 50 without use of component 56.

The transfer of heat from the component 34 to the coolant 42 or 44 is modelled simply. All the heat flow paths, through solid materials and into the coolant, are grouped together so that there is some combined thermal conductance B between the component at an average temperature Tc and the coolant at an average temperature TA. The heat flow rate through the heat exchanger from the component into the coolant is then given by $$\theta(T_C - T_A)$$

The coolant flow rate does not appear in this formula because it does not directly affect the heat flow. The effect of changing the coolant flow rate is to change $T_A$, nothing else. In this way it does have an effect on the heat flow, but indirectly.

For a heat exchanger which is cooling something which is at a uniform temperature Tc with coolant which enters at temperature $T_I$ and leaves at temperature To the effective average coolant temperature difference is most accurately given by a formula based on the logarithmic mean of the coolant temperatures:

$$T_C - T_A = \frac{T_O - T_I}{\ln\frac{T_C - T_I}{T_C - T_O}}$$

However, in this analysis, for simplicity, the arithmetic mean of the coolant temperatures is used, i.e.

$$T_C - T_A = T_C - \frac{T_O + T_I}{2}$$

This gives a value which is close to that using the logarithmic mean, particularly when the rise in coolant temperature is small compared to the difference between the component temperature and the coolant temperature. For example, if $T_1=20$, $T_0=30$ and Tc=50 the logarithmic mean gives 24.6 as the effective temperature difference and the arithmetic mean gives 25.0. Using the arithmetic mean makes the subsequent algebraic manipulation more tractable.

Analysis

It has been recognized by the present applicant that with the use of these defining conditions, improved control of the temperature of the component 34 can be achieved.

If Tc is unchanging the heat gained by the coolant must equal the heat being dissipated in the component, so this gives $$(T_O - T_I)C_A G = W \quad (1)$$

Let the effective thermal conductance of the total heat flow path between the component and the coolant be θ watts per ° C. Then it follows that $$\theta\left(T_C - \frac{T_O - T_I}{2}\right) = W \quad (2)$$

(2) can be arranged to give $$T_O = 2T_C - T_I - \frac{2W}{\theta},$$

which shows the counterintuitive result that if the coolant flow rate is adjusted to keep Tc constant as the dissipation varies, To will fall as the dissipation increases. It is therefore preferable to measure the temperature of the component directly, rather than inferring it from the coolant temperatures; however, there may be situations where it is not possible to measure the component temperature directly, and it has to be inferred from the coolant temperatures.

$T_O$ can be eliminated by combining (1) and (2), and thereby provide an algebraic expression for G, representing the mass flow rate of the coolant as follows:

$$G = \frac{W}{2C_A\left(T_C - T_I - \frac{W}{\theta}\right)} \quad (3)$$

Change in Dissipation

If the dissipation changes, the coolant flow rate G must change to maintain the same component temperature. With Tc, $T_1$ and e constant, differentiating equation (3) with respect to W gives $$\frac{dG}{dW} = \frac{T_C - T_I}{2C_A\left(T_C - T_I - \frac{W}{\theta}\right)^2}$$

Using equation (2) to eliminate $$\frac{W}{\theta}$$

gives $$\frac{dG}{dW} = \frac{2(T_C - T_I)}{C_A(T_O - T_I)^2}$$

Therefore for small changes in dissipation we have $$\delta G \approx \frac{2(T_C - T_I)}{C_A(T_O - T_I)^2} \delta W \quad (4)$$

which simply defines how to change the coolant flow rate for a given change in dissipation, without having to know the present dissipation nor the value of e.

If the dissipation changes, for example increases, since initially the amount of heat being removed by the coolant is unchanged, the extra dissipation will cause the temperature of the component to start to rise, the rate of rise being proportional to the amount by which the dissipation has increased. In fact, it can be said that $$\frac{dT_C}{dt} = \frac{\delta W}{H}$$

where H is the heat capacity of the component. This can then be combined with (4) to get $$\delta G \approx \frac{2H(T_C - T_I)}{C_A(T_O - T_I)^2} \frac{dT_C}{dt} \quad (5)$$

This is reminiscent of the derivative term in a PID controller, in which $$\delta G = K_D \frac{dT_C}{dt},$$

where $K_D$ is the parameter controlling the influence of the derivative term on the coolant flow. The key difference is that it follows that equation (5) shows that the influence of the derivative term is not constant, as it is in a conventional PID controller, but rather should depend on the values of the three temperatures Tc, To and $T_I$.

Thus, the use of temperature data regarding the heat transfer fluid enables improved determination of control parameters for use in a method and apparatus for temperature control of a storage device within a storage system.

Change in Setpoint Temperature

When the component temperature has stopped changing, equation (5) will cease to cause the coolant flow rate to change, but there is no guarantee that the stable temperature thus reached is the setpoint temperature. To discover how this can be achieved the effect of changing the setpoint temperature is investigated, so that Tc reaches a new value. To see how the coolant flow rate should change as a result of a new value for Tc equation (3) is differentiated with respect to Tc, with W, $T_I$ and θ constant, to get $$\frac{dG}{dT_C} = \frac{-W}{2C_A\left(T_C - T_I - \frac{W}{\theta}\right)^2}$$

Again, using equation (2) to eliminate $$\frac{W}{\theta}$$

this gives $$\frac{dG}{dT_C} = \frac{-2W}{C_A(T_O - T_I)^2}$$

and using equation (1) to eliminate W we then get $$\frac{dG}{dT_C} = \frac{-2G}{T_O - T_I}$$

Thus, for small changes in component temperature we have $$\delta G \approx \frac{-2G}{T_O - T_I}\delta T_C \quad (6)$$

If the change in setpoint temperature is small we have δTc=Ts−Tc: and equation (6) then becomes $$\delta G \approx \frac{2G}{T_O - T_I}(T_C - T_S) \quad (7)$$

In PID terminology $Tc-T_S$ is known as the error as it represents the difference between actual temperature Tc and desired temperature Ts. Equation (7) is reminiscent of the proportional term in a PID controller, in which δG=KP (Tc−Ts), where Kp is the parameter controlling the influence of the proportional term on the coolant flow. The key difference is that in equation (7) the value δG depends also on the values of the two coolant temperatures $T_1$ and $T_0$. In other words, it is not constant as it is, by definition assumed to be in a PID controller, but rather depends on the values of the coolant temperatures and on the coolant flow rate G.

Again then, the use of temperature data regarding the heat transfer fluid enables improved determination of control parameters for use in a method and apparatus for temperature control of a storage device within a storage system.

Equation (7) ensures that Tc returns to Ts, even though equation (5) cannot do this.

Ambient Air Changes

Changes in the input air temperature or its humidity will affect the amount of cooling provided, either directly when the coolant is air, or indirectly when the coolant is liquid if the heat in the liquid is expelled to the ambient air via the radiator 30. In either case, the effect is to change $T_1$.

If equation (3) is differentiated with respect to TJ, with W, Tc and θ constant, we get $$\frac{dG}{dT_I} = \frac{W}{2C_A\left(T_C - T_I - \frac{W}{\theta}\right)^2}$$

Again, using equation (2) to eliminate $$\frac{W}{\theta}$$

we get $$\frac{dG}{dT_I} = \frac{2W}{C_A(T_O - T_I)^2}$$

and using equation (1) to eliminate W we get $$\frac{dG}{dT_I} = \frac{2G}{T_O - T_I}$$

Therefore for small changes in coolant input temperature we have $$\delta G \approx \frac{2G}{T_O - T_I}\delta T_I \quad (8)$$

If $T_I$ rises, the average coolant temperature felt by the heat exchanger 32 will rise, so the rate at which heat is extracted from the component 34 will fall. This has a similar effect to a rise in dissipation of the component, and can therefore be handled by equation (5). Therefore, if the changes in $T_1$ are expected to be small or slow, it may not be necessary to include the contribution of equation (8) in the implementation.

Thus, it can be seen that using the above analysis, a more accurate methodology can be provided for controlling the temperature of a component. In particular, by taking into account the actual temperatures of the coolant (prior and after it has encountered the component being cooled) as well as the temperature of the component, it can be seen that a more precise control of the temperature of the component can be achieved. Instead of simply relying on the temperature of the component, the temperature of the coolant is taken into account as well.

Combined Changes

Typically, there will be more than one change in the system parameters at any one time. For example, it is possible that there will be a change of dissipation at the same time as a change in set point temperature and/or input coolant temperature. In such a situation, the change in coolant flow needs to be the sum of the changes determined by equations (5) and (7) and possibly (8) too.

For a number of reasons to be described, it is desirable to introduce tuning parameters $K_D$, $K_P$ and $K_T$ to control the relative influence of equations (5), (7) and (8). These reasons include the fact that there will be some interaction between the equations (5), (7) and (8), and that differences between this simple model and the actual situation need to be catered for. Furthermore, instability problems are preferably avoided. It is also desired that the resulting change in coolant flow rate be measured in flow rate register units rather than grams per second, as this enables the value to be changed in the flow rate register by the equivalent amount generated by equations (5), (7) and (8).

In a conventional PID controller, so as to ensure a sufficiently quick response to a changing situation without excessive overshoot, it is necessary to have chosen the three parameters $K_P$, $K_I$ and $K_D$ carefully. In practice, making these choices can be laborious and difficult. It is made more difficult by the fact that there may be several factors which can cause the driving situation to change. The three most common, as discussed above, are a change in the heat dissipation of the component having its temperature controlled, a change in the ambient air temperature and a change in the set point temperature. Choosing values for the parameters $K_P$, $K_I$ and $K_D$ can involve significant experimentation to model and understand the behavior that results from various combinations of parameter values, including measurement of the period of oscillation that may be provoked. However, this is within the knowledge of a skilled person.

Equations (7) and (8) will be correct whatever units are used for the coolant flow rate, because here the change in coolant flow rate is proportional to the coolant flow rate. It is therefore convenient simply to define a flow rate variable F and use flow rate register units in equations (7) and (8), and they are then better stated as $$\delta F \approx \frac{2F}{T_O - T_I}(T_C - T_S) \quad (9)$$

$$\delta F \approx \frac{2F}{T_O - T_I}\delta T_I \quad (10)$$

Equation (5) generates a change of coolant flow rate G measured in grams per second. Therefore a conversion factor $k_F$ must be applied to the output of equation (5) to convert grams per second into flow rate register units.

Also, before equation (5) can be used to calculate the change in coolant flow rate, the value of H (the heat capacity of component 34) needs to be known. Its value and the value of the conversion factor $k_F$ can be determined in any convenient way. One example would be by a simple experiment, as follows.

1. Allow the system to reach a stable situation. Let the flow rate register contain the value FM. The coolant flow rate must not be allowed to change during the experiment.
2. Note the values of $T_I$ and $T_O$; call them $T_{Ia}$ and $T_{Oa}$.
3. Change the power being dissipated in the component by the amount $W_M$. As will be seen, it turns out that the amount does not need to be known, but it must be constant throughout the experiment.
4. Observe the immediate rate of change of the temperature of the component; call it Re.

5. The value of H is then given by $$H = \frac{W_M}{R_C}.$$

6. When the system has again reached a stable situation, note the new value of $T_O$; call it $T_{Ob}$. Also again note the value $T_I$ in case it has changed; call it $T_{Ib}$.
7. Let $TM = (T_{Ob} - T_{Ib}) - (T_{Oa} - T_{Ia})$.
8. Using equation (1) it can be shown that the value of kF is given by $$k_F = \frac{F_M C_A T_M}{W_M}.$$

$k_F$ and H will be multiplied together in equation (5), and divided by $C_A$. It is advantageous to use a new coefficient which combines all these. Let this be M, where $$M = \frac{k_F H}{C_A} = \frac{F_M C_A T_M}{W_M} \frac{W_M}{R_C} \frac{1}{C_A} \quad (11)$$

Therefore $$M = \frac{F_M T_M}{R_C}$$

showing that the value of $W_M$ does not need to be known. The algebra also shows that $C_A$ and H have disappeared and so do not need to be known. Thus, equation (5) then becomes $$\delta F = \frac{2M(T_C - T_I)}{(T_O - T_I)^2} \frac{dT_C}{dt} \quad (12)$$

The complete expression for the change in coolant flow rate therefore becomes $$\delta F = K_P \frac{wF}{T_O - T_I}(T_C - T_S) + K_D \frac{2M(T_C - T_I)}{(T_O - T_I)^2} \frac{dT_C}{dt} + K_T \frac{2F}{T_O - T_I} \delta T_I \quad (13)$$

remembering that the third component can be omitted if any $\delta T_I$ will be small.

In some embodiments it may not possible to measure the component temperature directly, and it has to be inferred from the two coolant temperatures $T_1$ and $T_O$; for example it may be decided to approximate it by $T_O$. In this case the inferred value should be used for Tc in equation (13).

In an embodiment, the temperatures and sensors used to measure them, will take a finite time to react to a new coolant flow rate. Accordingly, in one digital implementation of the present method and system, the temperatures To, Tc and T1 are sampled at regular intervals rather than continuously, the intervals being long enough to allow the sensors to react and detect when there has been a change in the temperature. The delay period can be selected to be any appropriate length and would typically be several seconds, for example 10 seconds for a disk drive enclosure; for other systems the period could be significantly different. The rate of change of Tc is taken to be proportional to the difference between successive samples $\Delta T_s$, the samples being taken every $\Delta t$ seconds.

Figure 5:
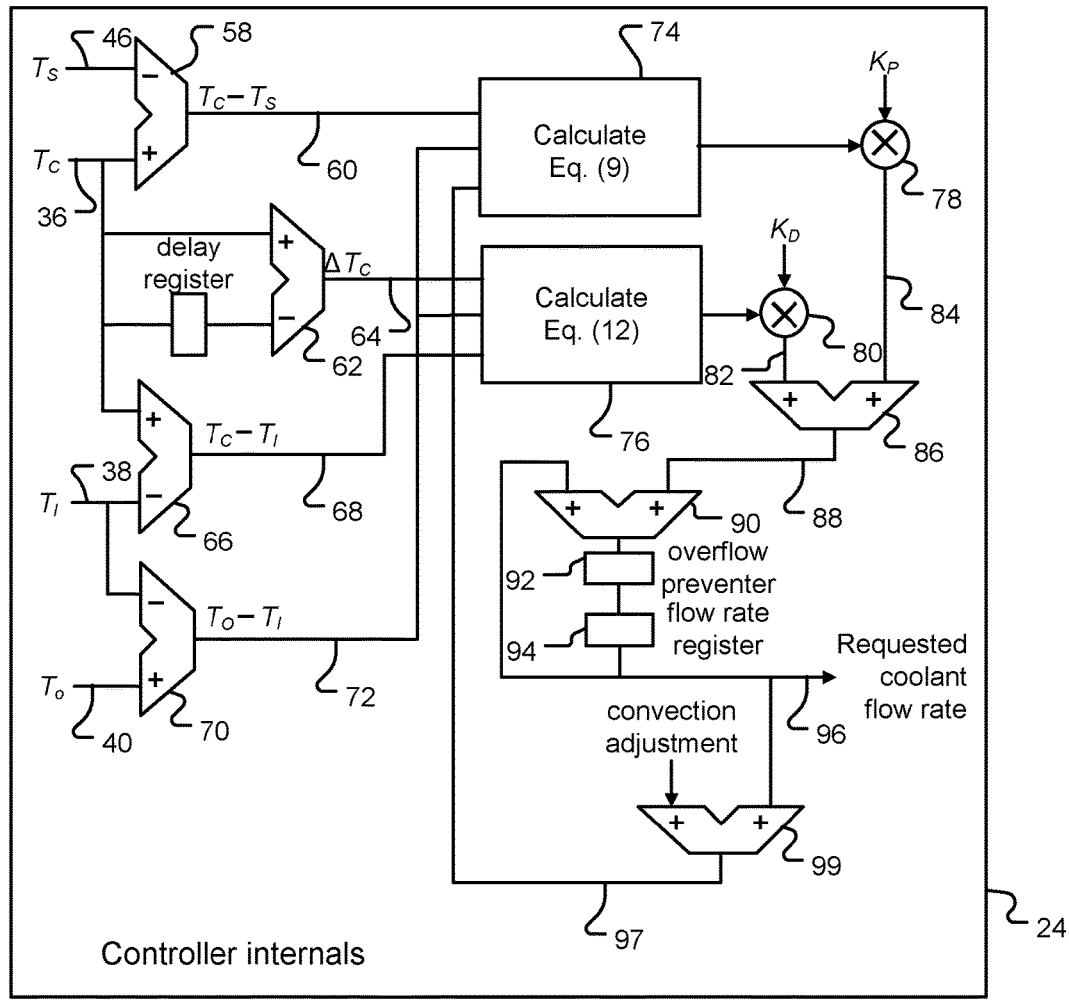
FIG. 5 is a schematic representation of the internal components of a controller such as that shown in either of FIG. 3 or 4.

FIG. 5 shows a schematic representation of the internal components of a controller 24. It will be understood that the controller 24 can be embodied in any appropriate manner. For example, it may be provided as one or more of an Application Specific Integrated Circuit (ASIC), programmable logic such as a Field Programmable Gate Array (FPGA) or it could be embodied in software to run on a computer or processor.

The controller is shown receiving signals Ts 46 representing the set point temperature, Tc 36 representing the component temperature, $T_1$ 38 representing the coolant temperature at the input to the heat exchanger and $T_O$ 40 representing the coolant temperature at the output of the heat exchanger. A first subtraction unit 58 is provided, arranged to receive the signals Ts and Tc and generate a difference output signal 60. A second subtraction unit 62 is provided, arranged to subtract a previous value for the component temperature Tc from the current value and generate an output signal $\Delta$Tc 64. A further subtraction unit 66 is provided arranged to receive as inputs the component temperature Tc and to subtract from this the coolant temperature at the input to the heat exchanger $T_1$. An output signal 68 is generated from the further subtraction unit 66.

Next, a subtraction unit 70 is provided arranged to receive as inputs the coolant temperature at the output of the heat exchanger To and the coolant temperature at the input to the heat exchanger $T_1$. An output signal 72 representing the difference between these two is provided. Logic units 74 and 76 are provided within the controller to execute equations (9) and (12), respectively, using as inputs various of the output signals 60, 64, 68 and 72.

Multipliers 78 and 80 are provided arranged to receive the outputs from the logic units 74 and 76. In addition, the multipliers 78 and 80 are arranged to receive as inputs the factors $K_P$ and $K_D$. First multiplier 78 generates an output as the product of $K_P$ with the output from logic unit 74. Second multiplier 80 generates an output as the product of $K_D$ with the output from logic unit 76. The outputs 84 and 82 from the first and second multipliers 78 and 80 are provided to an adder 86 which produces an output 88 to function as one of the inputs to a downstream adder 90. Since output 88 is the requested change in coolant flow rate, it must be added to the current coolant flow rate held in flow rate register 94 to get the new desired flow rate. This addition is performed in adder 90. An overflow preventer 92 holds the value in the flow rate register at its maximum value if adder 90 attempts to increase it further; without overflow preventer 92 conventional addition would cause the value in flow rate register 94 to change to a very low value, which is clearly undesirable when at least the maximum flow rate is needed. Similarly overflow preventer 92 prevents the minimum value in flow rate register 94 from being decremented further, resulting in an unwanted high value in flow rate register 94. Flow rate register 94 generates an output signal 96 representative of a requested coolant flow rate. Thus, the signal 96 is not simply a signal to drive a pump or fan based simply on the temperature of the component and the set point, but rather is based on the flow rate of the coolant taking into account the function of the system itself including for example, the component and heat exchanger etc.

Logic unit 74 needs to know the current coolant flow rate in order to make its calculations. Because even when the fan or pump is not operating a small flow due to convection will occur, adder 99 adds a small amount to the requested coolant flow rate 96 to generate signal 97 used by logic unit 74. This ensures that the coolant flow rate value seen by logic unit 74 is never zero, which improves its behavior when the fan or pump is not operating, for example when first switching on.

In certain applications, there may be some fan or pump speeds which cannot be used. For example, if a particular fan speed excites a resonance in a disk enclosure, the resulting vibration may seriously affect the data rate achieved by the disk drive. This can occur because of all the retrying that must occur to overcome the data errors caused by the excessive vibration. Accordingly, in one preferred embodiment, certain fan speeds are censored with the use of a speed censor which substitutes a close allowed speed for the one requested by the controller. Preferably, the speed censor substitutes the nearest allowed speed for the one requested by the controller. This will ensure that the actual speed at which the fan is driven is as close as possible to the required determined speed but will not cause any undesirable vibration due to resonance of the system.

It will of course be noted that a conventional PID controller has no knowledge of the actual fan speed being used and the unexpected response (a bigger change than requested) to a change of fan speed to a particular value, can cause stability problems. Thus, by utilizing knowledge of the fan speed and a fan speed censor this problem is addressed.

Figure 6:
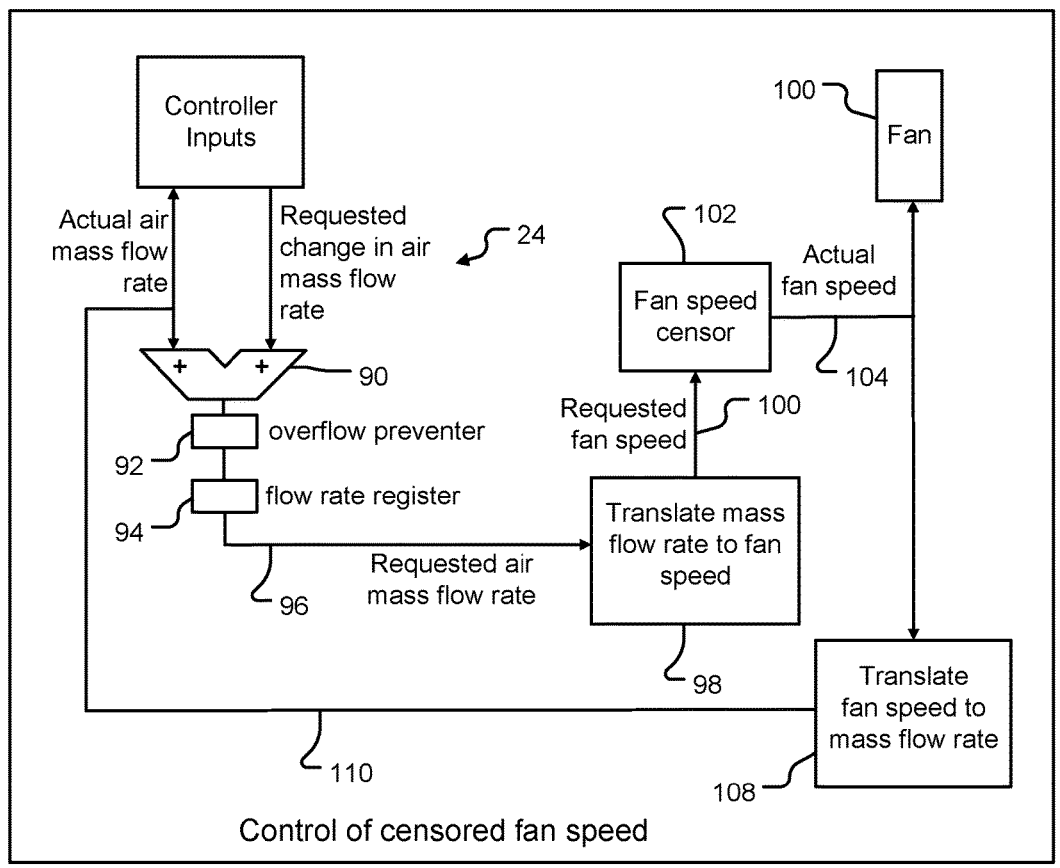
FIG. 6 is a schematic representation of a controller including a censored fan speed component.

The present system, in contrast to a conventional PID controller, does take into account the coolant flow rate F. It directly influences the proportional term. Also, $T_O$ depends on the fan/pump speed and is used in both proportional and derivative terms so this is another way in which the improved controller is aware of the actual fan speed. Thus, it is able to react more appropriately and is less likely to experience stability problems in the manner described above for a conventional PID controller. FIG. 6 shows the modifications provided to cope with censored fan speeds. It will be appreciated that a liquid coolant version is very similar although the translators between mass flow rate and fan/pump speed may be omitted.

Referring now to FIG. 6, a controller 24 is provided which is typically a controller such as that shown above and described with reference to FIG. 5. The controller generates a signal 96 representative of a requested air mass flow rate, as described above with reference to FIG. 5. However, in addition to the components shown in FIG. 5, a translator 98 is provided arranged to receive the output signal 96 from the controller 24 and to generate in response, a requested fan speed 100. The requested fan speed is provided to a fan speed censor 102 which determines whether or not the requested fan speed is one which is likely to generate resonance or be undesirable for any other reason, as described above. An output signal 104 is provided by the fan speed censor 102 and this is provided to a fan 106 which then operates accordingly.

In addition, the actual fan speed signal 104 is provided to a second translator 108 whose output 110, the actual air mass flow rate, is arranged in a loop back mode to the adder 90 and to the adder which adds in the convection adjustment, which is contained within controller 24.

Thus, a simple and robust means is provided by which fan speeds likely to cause undesirable effects can be avoided and the system can be operated in such a way that will avoid the risk of resonance occurring.

Multiple Component System

Thus far, the description has been with reference to a simple system in which a single component is provided having a single temperature and being cooled by operation of a single pump or fan. In practice, typically, multiple components will be provided within a storage system and cooling means and control will be required accordingly.

Figure 7:
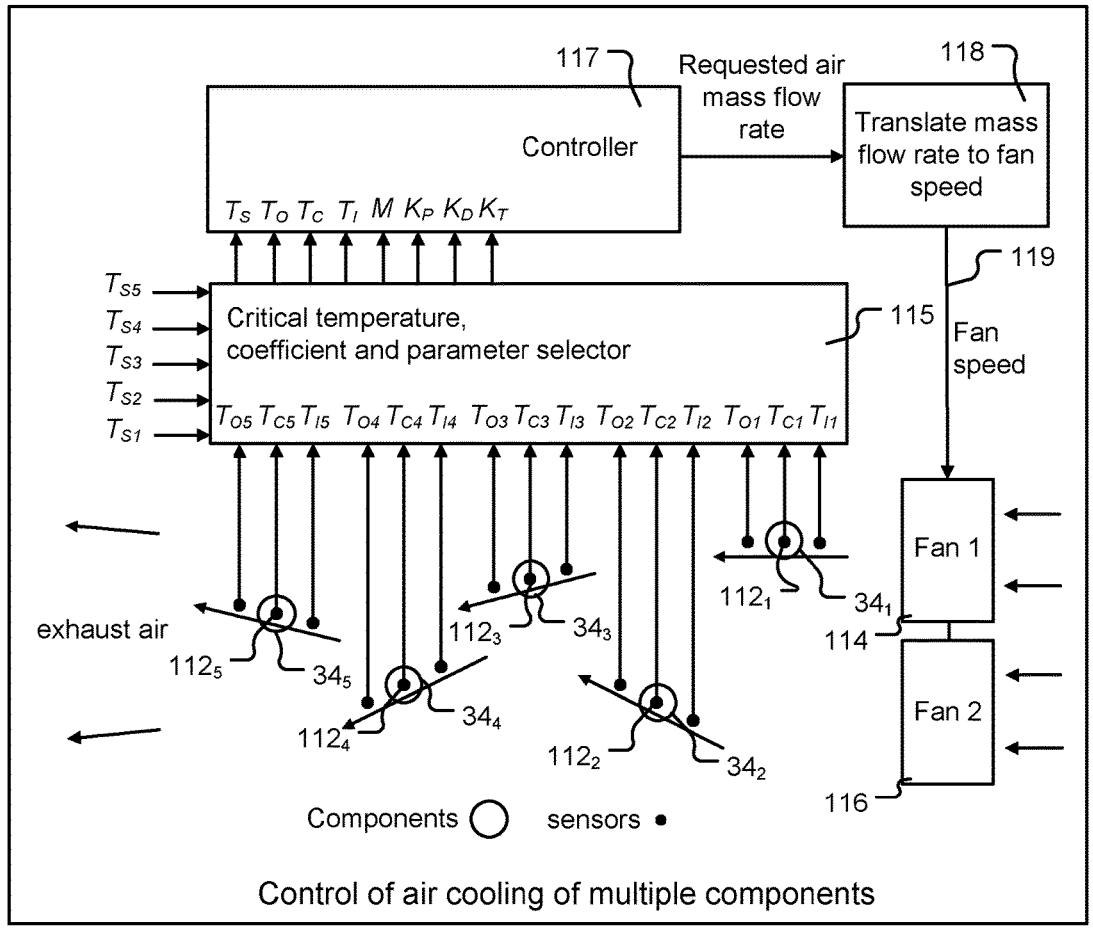
FIG. 7 is a schematic representation of a controller for the control of air using plural fans for cooling multiple components.

FIG. 7 shows a schematic representation of a system including plural components $34_1$ to $34_5$. Thus, each of the components has an associated temperature sensor $112_1$ to $112_5$. Similarly, input and output temperatures of the air flow are measured and provided for each of the components $34_1$ to $34_5$. The present method may be applied to equipment in which several components are cooled by coolant flow provided by one pump or by one fan (or fans operating in parallel), for example in an air-cooled disk drive enclosure. The coolant may flow in a complex manner around the various components, some being in a parallel configuration, others in series configuration and combinations of both, the flows separating and remixing. The fans or pumps operate at the same speed, but different proportions of the total coolant flow will be felt by each of the components $34_1$ to $34_5$.

To apply the present method to this situation, it is necessary that it be possible to measure the coolant temperature before and after it flows over each component whose temperature needs to be controlled. This may be more readily achieved in a liquid cooled situation, where coolant is piped between the components and in particular where the components are in series in the coolant flow.

Since there are several components whose temperature needs to be monitored and controlled, a way of selecting one of or combining these temperatures in order to decide what changes in coolant flow are needed is desired. Various possible techniques for arriving at a selected temperature include:

1. Selecting the component whose temperature is closest to exceeding or which has most exceeded some critical temperature for the component;
2. Knowing and applying the rate of change of each component's temperature, selecting that component whose temperature is likely to have been closest to exceeding, or which will have most exceeded some critical temperature for that component during a sampling time period; and
3. Performing some form of averaging process on the component temperatures and varying the control of the pumps or fans accordingly.

In the present case, techniques 1 and 2 are most readily used by the present method, since as well as selecting the most critical component, that component's coolant input and output temperatures can be selected to provide inputs to the change in coolant flow formula, derived above. If method 3 above is used, then there also needs to be a suitable way of combining the input and output coolant temperatures, which may be difficult.

Further analysis of the multiple component scenario assumes that component j of N components has been selected to influence the coolant flow; its temperature is $T_{Cj}$ and its setpoint temperature is $T_{Sj}$. Its coolant input and output temperatures are $T_{Ij}$ and $T_{Oj}$ respectively. Its thermal capacity is $H_j$, the thermal conductance to its airflow is $\theta_j$, and its dissipation is $W_j$.

Let the proportion of the total coolant mass flow rate which passes over each component be $a_1$, so that the coolant mass flow rate felt by each component is $a_j G$ grams per second, which is $a_j F$ in flow rate register units. Note that it is not necessarily the case that $$\sum_{j=1}^{N} a_j = 1,$$

because some flows may be in series, and some flow may miss all components.

With this nomenclature, equation (3) becomes for each component $$a_j G = \frac{W_j}{2 C_A \left( T_{Cj} - T_{Ij} - \frac{W_j}{\theta_j} \right)}$$

so equation (5) becomes $$a_j \delta G \approx \frac{2 H_j (T_{Cj} - T_{Ij})}{C_A (T_{Oj} - T_{Ij})^2} \frac{dT_{Cj}}{dt} \qquad (5m)$$

i.e., $$\delta G \approx \frac{2 H_j (T_{Cj} - T_{Ij})}{a_j C_A (T_{Oj} - T_{Ij})^2} \frac{dT_{Cj}}{dt}$$

Also equation (9) becomes $$a_j \delta F \approx \frac{2 a_j F}{T_{Oj} - T_{Ij}} (T_{Cj} - T_{Sj}) \qquad (9m)$$

i.e., $$\delta F \approx \frac{2F}{T_{Oj} - T_{Ij}} (T_{Cj} - T_{Sj})$$

and similarly equation (10) becomes $$\delta F = \frac{2F}{T_{Oj} - T_{Ij}} \delta T_{Ij} \qquad (10m)$$

In order to use equation (5m) we need to know the value of each $H_j$; therefore the previously described experiment must be performed on each of the j components. We also need to know the values of each $a_j$ and the coolant flow conversion factor $k_F$. Although $k_F$ must be the same for all components, we derive the factor $k_{Fj}$ for each of the components. The experiment then becomes:

1. Allow the system to reach a stable situation. Let the flow rate register contain the value $F_M$; the coolant flow rate must not be allowed to change during the experiment. Each component will therefore experience a flow rate represented by $a_j F_M$.
2. For each component j note the values of $T_{Ij}$ and $T_{Oj}$; call them $T_{Ija}$ and $T_{Oja}$.
3. Change the power being dissipated in all components. Let the dissipation of each component change by the amount $W_{Mj}$. As will be seen, it turns out that the amounts do not need to be known.
4. Observe the immediate rate of change of the temperature of each component; call it $R_{Cj}$.
5. When the system has again reached a stable situation, note the new $T_{Ij}$ and $T_{Oj}$; call them $T_{Ijb}$ and $T_{Ojb}$.
6. Let $T_{Mj} = (T_{Ojb} - T_{Ijb}) - (T_{Oja} - T_{Ija})$.

(Note: if the change in power dissipation is to reduce the dissipation to zero, in the new stable situation we will have $T_{Ojb} = T_{Ijb}$, in which case the formula for $T_{Mj}$ simplifies to $T_{Mj} = -(T_{Oja} - T_{Ija})$ and of course there is no need to wait for the situation to stabilize.)

The value of $H_j$ is then given by $$H_j = \frac{W_{Mj}}{R_{Cj}}$$

The value of $k_{Fj}$ is given by $$k_{Fj} = \frac{a_j F_M C_A T_{Mj}}{W_{Mj}}$$

In equation (5m) $k_{Fj}$ and $H_j$ will be multiplied together and divided by $a_j$ and by $C_A$. Let the coefficient which combines all these be $M_j$, where $$M_j = \frac{k_{Fj} H_j}{a_j C_A} \qquad (11m)$$

$$= \frac{a_j F_M C_A T_{Mj}}{W_{Mj}} \frac{W_{Mj}}{R_{Cj}} \frac{1}{a_j} \frac{1}{C_A}$$

$$= \frac{F_M T_{Mj}}{R_{Cj}}$$

Equation (11m) is the same formula as equation (11), with the addition of the j subscripts, and shows that $a_j$ is another parameter whose value does not need to be known.

In other words, it is not necessary to know how the coolant flow is distributed amongst the components. The original formula equation (13) for the combined change in coolant flow required for one component can therefore be used for multiple components, provided that the temperatures and the M coefficient apply to the selected component for which the coolant flow is about to be adjusted. Combining equations (9m), (5m), (11m) and (10m) formula (13) then becomes $$\delta F = K_{Pj} \frac{2F}{T_{Oj} - T_{Ij}} (T_{Cj} - T_{Sj}) + \qquad (13m)$$

$$K_{Dj} \frac{2M_j (T_{Cj} - T_{Ij})}{(T_{Oj} - T_{Ij})^2} \frac{dT_{Cj}}{dt} + K_{Tj} \frac{2F}{T_{Oj} - T_{Ij}} \delta T_{Ij}$$

In this scenario, when components are cooled in series, the $T_I$ of one component will be influenced by the $T_O$ of another component. Some of the $T_I$ are therefore likely to change significantly, and the control of coolant flow rate may benefit from the inclusion of the third component of equation (13m) since some $\delta T_I$ may not be small.

As above in the case of a single component, in some embodiments it may not possible to measure the component temperature directly, and it has to be inferred from the two coolant temperatures $T_{Ij}$ and $T_{Oj}$; for example it may be decided to approximate it by $T_{Oj}$. In this case the inferred value should be used for $T_{Cj}$ in equation (13).

Thus, in the representation shown in FIG. 7, there is not a single set point signal, but rather five separate set point signals, one for each of the components $34_1$ to $34_5$. However, since each of the fans 114 and 116 can each only operate at one speed at any one time, some means for selecting the speed based on the various temperatures of the components and other parameters is utilized, as described above. This is implemented in selector 115, which receives all the four temperatures associated with every component, and decides which component will influence the next change in coolant rate. It passes the four temperatures of the selected component to controller 117. Selector 115 also stores the $K_P$, $K_D$, $K_T$ parameters and the M coefficient associated with each component, and passes the parameters for the selected component to controller 117.

As shown, in the example of FIG. 7, a component 118 is provided to translate the requested mass flow rate received from the controller 117 into a fan speed request 119, again as described above.

Figure 8:
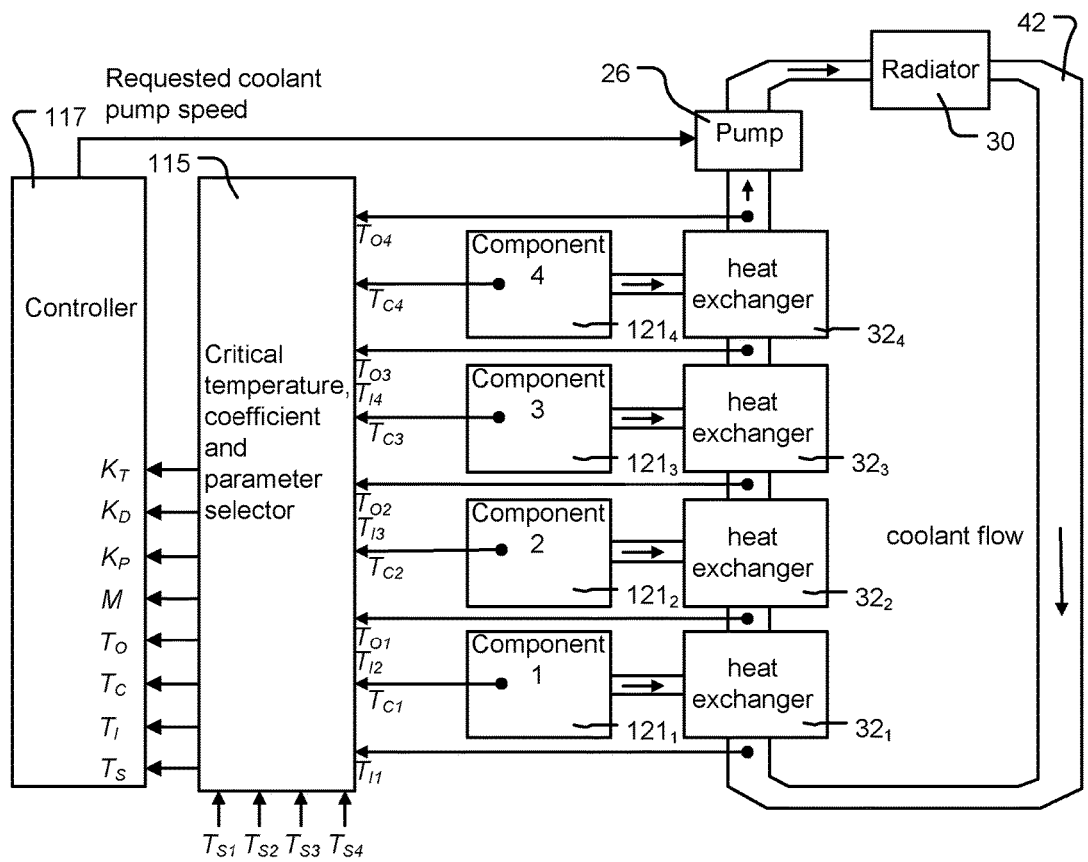
FIG. 8 is a schematic representation of a liquid based cooling system together with a controller for the liquid based cooling system for cooling multiple components.

FIG. 8 shows a schematic representation of an arrangement similar to that of FIG. 7. However, in this case instead of the use of fans and air to provide cooling of the components $34_1$ to $34_5$, in this case heat exchangers $32_1$ to $32_4$ are provided in a coolant flow circuit 42 powered by a pump 26 and including a radiator 30 from which heat received by the heat exchanger $32_1$ to $32_4$ from the components 1 to 4 may be radiated to atmosphere.

In other ways, the signals provided to the controller 117 are the same as those to provided to the controller 117 of FIG. 7. A critical temperature, coefficient and parameter selector 115 is again provided, arranged to select which of the values that it receives from the various components and coolant flows are provided to the controller 117 so as to generate the drive signal for the pump 26. Four serially cooled components $121_1$ to $121_4$ are provided. The output coolant temperature from one component can be the input coolant temperature for another component such that one temperature sensor will suffice to determine both temperatures.

Thus, the number of temperature sensor components required for this configuration is correspondingly reduced. Thus, by use of the present method and system, it is possible to calculate the correct changes in coolant flow needed to maintain a component temperature at a set point temperature, without knowing such characteristics of the system as the thermal conductivity between the component and the coolant, the heat capacity of the component, and the present dissipation of the component. The required information is deduced from the measurement of three temperatures, the component temperature, the input coolant temperature and the output coolant temperature. Thus, the method and system is inherently able to cope with changes which alter such characteristics. In contrast to conventional PID controllers, the behavior of the present controller is more robust since the relative contributions of the proportional and derivative terms are not constant, but vary according to circumstances. This robustness allows the improved controller to cope better with fan or pump speed censorship in the manner described above.

It will thus be appreciated, that in contrast to a conventional PID controller, the present controller uses three temperatures to control a fan or pump speed, and not just the temperature of the component. The use of additional temperatures enables the controller to predict the necessary change to the coolant flow rate. A conventional PID controller has no a priori knowledge of the behavior of the thing it is controlling, and merely affects this indirectly by virtue of the output signal it produces to drive a fan or pump. The present controller uses the current coolant mass flow rate when calculating a change in coolant mass flow rate needed. This enables it better to cope with coolant mass flow rates which differ from requested coolant mass flow rate, such as may occur when certain fan speeds cannot be used and an alternative has to be used instead. For example, as described above, when resonant situations are to be avoided this condition can arise.

As seen in equation 13 above, the term which uses the error value, is multiplied by an amount which depends on the two coolant temperatures and the coolant flow rate. In contrast, in a PID controller, the error term is proportional to the error value only. In addition, the term which uses the derivative of the controlled temperature is multiplied by an amount which depends on the three temperatures. In contrast, in a conventional PID controller, the derivative term is simply proportional to the derivative value.

The derivative term is primarily included because it can be used to predict the additional coolant flow rate needed when dissipation or input coolant temperature change. In a PID controller, this term is included to control the stability of the response. A third term which uses the change in input coolant temperature has no counterpart in a PID controller.

Constants (other than the tuning parameters) used in the formulae, are assigned values by performing simple experiments on the system, and observing how it reacts to changes in conditions. It is suggested that the tuning parameter values used when changing the set point temperature could be different from the values used when maintaining the temperature at the set point. Particular values may also be needed when starting from cold, i.e. when everything is at the same temperature. The controller outputs a value which is proportional to the requested coolant mass flow rate. Particularly in an air cooled system, the coolant mass flow rate through the system is not necessarily proportional to the fan speed, because the air flow inside the enclosure may be a mixture of laminar and turbulent air flow. Hence, a translation mechanism is used to translate coolant mass flow rate to fan speed. In a conventional PID controller, this translation does not occur, thus distancing it further from the detailed behavior of the system.

Thus, considering the advantages of the present system and method as compared to the use of a conventional PID controller, it can be seen that the tuning parameters are easier to set up because the system better predicts the correct coolant flow and within the control algorithms and algebra, there is an awareness of an ability to cope with changing scenarios, and thus tuning parameters do not have to be a compromise for various scenarios. The system is better able to cope with unusable fan speeds that can cause negative effects within the system, by the use of a speed censor. Separate tuning parameters for set point temperature changes means that the system behaves more predictably and better for large set point temperature changes.

As described at, for example, http://en.wikipedia.org/wiki/PID_controller (accessed 5 Mar. 2012), in a conventional PID controller the tuning parameters $K_P$, $K_D$, $K_I$ are typically chosen so that the system responds in a suitably timely fashion to changes, and in some cases with minimal overshoot in the controlled temperature. As with any system which has feedback and delays in its response it is possible, indeed quite easy, for oscillations to occur which are nearly always undesirable. The correct choice of these parameters is not a trivial matter.

Indeed, it is recognized that PID tuning is a difficult problem, even though there are only three parameters and the system as a whole is, in principle, simple to describe. This is because complex criteria must be satisfied within the limitations of PID control. There are accordingly various methods for such tuning.

Designing and tuning a PID controller appears to be conceptually intuitive, but can be hard in practice, if multiple (and often conflicting) objectives such as short transient and high stability are to be achieved. Usually, initial designs need to be adjusted repeatedly through computer simulations until the closed-loop system performs or compromises as desired.

Furthermore, some processes have a degree of non-linearity. Parameters that work well at full-load conditions may not work when the process is starting up from no-load. This can be corrected by gain scheduling, i.e. using different parameters in different operating regions. PID controllers often provide acceptable control using default tunings, but performance can generally be improved by careful tuning, and performance may be unacceptable with poor tuning.

Referring to the present system, the equations derived above for change in coolant flow show that there is non-linearity in its dependence on the three measured temperatures. In other words the process being controlled is non-linear. In this situation it is difficult to choose one set of parameters which will give optimum behavior in all situations. However, by multiplying the parameters by terms which depend on the three temperatures, i.e. which depend on the current situation, different tuning parameters for each situation are, in effect, provided. Thus, use of data regarding the heat transfer fluid, makes it possible to choose parameters which give more optimum behavior across the range of situations with which the controller has to cope.

A form of active "gain scheduling" as referred to above is provided, by the use of the (possibly changing) data regarding the heat transfer fluid. It is a superior form of gain scheduling, because instead of dividing the situation up into a finite number of operating regions, it provides an essentially infinite number of operating regions, because the tuning parameters are multiplied by expressions which depend on, in some examples, the three measured temperatures. It is also superior in that the adjustment of the parameters is automatic or active, as it is based on the information provided by the two additionally measured coolant temperatures.

This contrasts with gain scheduling in a conventional PID controller at least by virtue of the measurement of and the use of data regarding the heat transfer fluid, i.e. the two coolant temperatures, to provide an effective adjustment of the parameters. A conventional PID controller only knows the component temperature. This lack of additional information means that any gain scheduling done must be less optimum.

This automatic or active adjustment of the parameters becomes even more valuable when the temperature of several components is being monitored and controlled.

The value of the coefficient M is derived from an experiment on the equipment, rather than being calculated from knowledge of the physical characteristics of the equipment. This means that the value of M that is used is the one that is seen by the controller from its knowledge of the temperatures, which due to inaccuracies in the model may not be the same as the theoretically calculated value. In this way, some inaccuracies of the model are factored out. Furthermore, the present system can readily be applied to multiple component scenarios without needing any additional experiments to determine coefficient values to be performed. This is described above with reference to FIGS. 7 and 8.

A microcontroller which implements a conventional PID control method can be readily modifiable to implement the present improved control method. Thus, simply by measuring two additional temperatures with respect to the flow of coolant sufficient information is provided to characterize the system and allow a more sophisticated control method to be used.

Embodiments of the present invention have been described with particular reference to the examples illustrated. However, it will be appreciated that variations and modifications may be made to the examples described within the scope of the present invention.

What is claimed is:

1. A temperature control system for a storage system, the temperature control system comprising:
   a flow generator for generating a flow of heat transfer fluid to a component in the storage system;
   a set point generator for generating a set point signal indicative of a desired temperature for the component; and
   a controller generating an output signal to control the flow generator, the output signal based on the set point signal and temperature data of the heat transfer fluid.

2. The system according to claim 1, further comprising a heat exchanger in thermal communication with the component.

3. The system according to claim 2, further comprising:
   a first temperature sensor for sensing a temperature of the component;
   a second temperature sensor for sensing a temperature of the heat transfer fluid upstream of the heat exchanger; and,
   a third temperature sensor for sensing a temperature of the heat transfer fluid downstream of the heat exchanger.

4. The system according to claim 2, wherein the controller is a modified proportional, integral and derivative ("PID") controller, arranged to generate the output signal, using a factor that depends on temperatures of the heat transfer fluid both upstream and downstream of the heat exchanger.

5. The system according to claim 1, further comprising:
   a first temperature sensor for sensing a temperature of the component;
   a second temperature sensor for sensing a temperature of the heat transfer fluid upstream of the component; and
   a third temperature sensor for sensing a temperature of the heat transfer fluid downstream of the component.

6. The system according to claim 1, further comprising one or more couplings for coupling temperature signals from temperature sensors to the controller to generate the output signal.

7. The system according to claim 1, wherein the controller generates the output signal based on flow rate of the heat transfer fluid.

8. The system according to claim 1, wherein the heat transfer fluid is a gas and the flow is generated with a fan.

9. The system according to claim 1, wherein the heat transfer fluid is a liquid and the flow is generated with a liquid pump.

10. The system according to claim 1, wherein the controller generates the output signal using a factor that depends on change with respect to time of temperature of the component.

11. The system according to claim 1, wherein the controller is arranged to calculate a required change δF in flow rate of the heat transfer fluid in accordance with an equation:

$$\delta F = K_P \frac{2F}{T_O - T_I}(T_C - T_S) + K_D \frac{2M(T_C - T_I)}{(T_O - T_I)^2} \frac{dT_C}{dt} + K_T \frac{2F}{T_O - T_I} \delta T_I$$

wherein,
F is a heat transfer fluid flow rate;
$T_C$ is a measured component temperature;
$T_S$ is a set point temperature;
$T_I$ is a temperature of the heat transfer fluid before it flows into a heat exchanger;
$T_O$ is a temperature of the heat transfer fluid that flows out of the heat exchanger; and
$K_P$, $K_D$, $K_T$ and M are system constants.

12. The system according to claim 1, wherein a control component is selected such that its temperature is used to determine required changes in heat transfer fluid flow rate.

13. A system comprising:
   a housing having at least one component therein;
   a heat transfer fluid; and
   a temperature control system comprising:
      a first temperature sensor operably connected to the component;
      a second temperature sensor configured to sense the heat transfer fluid;
      a flow generator for generating flow of the heat transfer fluid;
      a set point generator having a set point signal indicative of a desired temperature for the component; and
      a controller generating an output signal to control the flow generator, the output signal based on the set point signal and temperature of the heat transfer fluid.

14. The system according to claim 13, further comprising a heat exchanger in thermal communication with the component.

15. The system according to claim 14, wherein the controller is a modified proportional, integral and derivative ("PID") controller, arranged to generate the output signal, using a factor that depends on the temperature of the heat transfer fluid both upstream and downstream of the heat exchanger.

16. The system according to claim 14, wherein the controller is arranged to calculate a required change δF in flow rate of the heat transfer fluid in accordance with an equation:

$$\delta F = K_P \frac{2F}{T_O - T_I}(T_C - T_S) + K_D \frac{2M(T_C - T_I)}{(T_O - T_I)^2} \frac{dT_C}{dt} + K_T \frac{2F}{T_O - T_I} \delta T_I$$

wherein,
F is a heat transfer fluid flow rate;
$T_C$ is a measured component temperature;
$T_S$ is a set point temperature;
$T_I$ is a temperature of the heat transfer fluid before it flows into the heat exchanger;
$T_O$ is a temperature of the heat transfer fluid that flows out of the heat exchanger; and
$K_P$, $K_D$, $K_T$ and M are system constants.

17. The system according to claim 13, wherein the second temperature sensor is operably connected to the heat transfer fluid upstream of the component; and, the system further comprising a third temperature sensor operably connected to the heat transfer fluid downstream of the component.

18. The system according to claim 13, wherein the heat transfer fluid is a gas, the flow is generated with a fan and the component is a storage device.

* * * * *